(12) United States Patent
Yun et al.

(10) Patent No.: US 7,384,866 B2
(45) Date of Patent: Jun. 10, 2008

(54) METHODS OF FORMING METAL INTERCONNECTIONS OF SEMICONDUCTOR DEVICES BY TREATING A BARRIER METAL LAYER

(75) Inventors: Ju-young Yun, Seoul (KR); Gil-heyun Choi, Kyungki-do (KR); Byung-hee Kim, Seoul (KR); Jong-myeong Lee, Kyungki-do (KR); Seung-gil Yang, Kyungki-do (KR); Jung-hun Seo, Gangwon-do (KR)

(73) Assignee: Samsung Electronics Co., Ltd. (KR)

( * ) Notice: Subject to any disclaimer, the term of this patent is extended or adjusted under 35 U.S.C. 154(b) by 350 days.

(21) Appl. No.: 11/095,006

(22) Filed: Mar. 31, 2005

(65) Prior Publication Data

US 2005/0179141 A1    Aug. 18, 2005

Related U.S. Application Data

(62) Division of application No. 10/373,368, filed on Feb. 24, 2003, now Pat. No. 6,955,983.

(30) Foreign Application Priority Data

May 30, 2002    (KR) .......................... 2002-0030294

(51) Int. Cl.
*H01L 21/4763* (2006.01)
*H01L 21/44* (2006.01)
*H01L 29/40* (2006.01)

(52) U.S. Cl. ...................... 438/627; 438/629; 438/637; 438/638; 438/640; 438/643; 438/653; 438/667; 438/668; 438/672; 438/675; 257/758; 257/759; 257/760

(58) Field of Classification Search ..................... None
See application file for complete search history.

(56) References Cited

U.S. PATENT DOCUMENTS 3,921,282 A * 11/1975 Cunningham et al. ...... 438/301
4,820,393 A    4/1989 Brat et al.

(Continued)

FOREIGN PATENT DOCUMENTS

EP        0 898 308 A2    2/1999

(Continued)

OTHER PUBLICATIONS

Notice to Submit Response, Korean Application No. 10-2002-0030294, May 6, 2004.

*Primary Examiner*—Carl Whitehead, Jr.
*Assistant Examiner*—James M Mitchell
(74) *Attorney, Agent, or Firm*—Myers Bigel Sibley & Sajovec, PA (57) ABSTRACT

A metal interconnection of a semiconductor device is fabricated by forming a dielectric pattern including a hole therein on a substrate, and forming a barrier metal layer in the hole and on the dielectric layer pattern outside the hole. At least some of the barrier metal layer is oxidized. An anti-nucleation layer is selectively formed on the oxidized barrier metal layer outside the hole that exposes the oxidized barrier metal layer in the hole. A metal layer then is selectively formed on the exposed oxidized barrier layer in the hole.

6 Claims, 4 Drawing Sheets

U.S. PATENT DOCUMENTS

| | | | |
|---|---|---|---|
| 4,976,839 A | 12/1990 | Inoue | |
| 5,070,036 A | 12/1991 | Stevens | |
| 5,254,872 A | 10/1993 | Yoda et al. | |
| 5,371,042 A | 12/1994 | Ong | |
| 5,378,660 A | 1/1995 | Ngan et al. | |
| 5,514,908 A | 5/1996 | Liao et al. | |
| 5,637,533 A * | 6/1997 | Choi | 438/643 |
| 5,696,017 A | 12/1997 | Ueno | |
| 5,911,857 A | 6/1999 | Kim | |
| 5,939,787 A | 8/1999 | Lee | |
| 6,001,420 A * | 12/1999 | Mosely et al. | 427/258 |
| 6,090,702 A | 7/2000 | Okamoto | |
| 6,139,700 A | 10/2000 | Kang et al. | |
| 6,143,645 A * | 11/2000 | Hsu et al. | 438/627 |
| 6,156,383 A | 12/2000 | Ishii et al. | |
| 6,217,721 B1 | 4/2001 | Xu et al. | |
| 6,229,211 B1 * | 5/2001 | Kawanoue et al. | 257/751 |
| 6,271,592 B1 | 8/2001 | Kim et al. | |
| 6,284,591 B1 | 9/2001 | Lee | |
| 6,346,746 B1 * | 2/2002 | Agarwal | 257/751 |
| 6,348,402 B1 | 2/2002 | Kawanoue et al. | |
| 6,376,355 B1 * | 4/2002 | Yoon et al. | 438/618 |
| 6,391,769 B1 * | 5/2002 | Lee et al. | 438/643 |
| 6,455,430 B2 | 9/2002 | Abe | |
| 6,569,756 B1 | 5/2003 | Sugai | |
| 6,602,782 B2 * | 8/2003 | Lee et al. | 438/674 |
| 6,638,852 B1 | 10/2003 | Karp | |
| 6,677,197 B2 * | 1/2004 | Kudelka et al. | 438/245 |
| 6,780,764 B2 | 8/2004 | Morita et al. | |
| 6,872,642 B2 | 3/2005 | Oda et al. | |
| 6,955,983 B2 | 10/2005 | Yun et al. | |
| 7,279,414 B1 * | 10/2007 | Yin et al. | 438/637 |
| 2001/0012685 A1 * | 8/2001 | Li | 438/627 |
| 2001/0013617 A1 * | 8/2001 | Toyoda et al. | 257/301 |
| 2001/0014529 A1 * | 8/2001 | Chen et al. | 438/637 |
| 2002/0090811 A1 * | 7/2002 | Kim et al. | 438/627 |
| 2002/0137321 A1 * | 9/2002 | Ku et al. | 438/592 |
| 2002/0187631 A1 | 12/2002 | Kim et al. | |
| 2003/0011014 A1 | 1/2003 | Basceri et al. | |
| 2003/0119303 A1 | 6/2003 | Morita et al. | |

FOREIGN PATENT DOCUMENTS

| | | | |
|---|---|---|---|
| JP | 405121356 | * | 9/1991 |
| JP | 406061359 | * | 3/1994 |
| JP | 11087272 | | 3/1999 |
| JP | 2000235978 | | 8/2000 |
| JP | 2001053027 | | 2/2001 |
| JP | 2001210606 | | 8/2001 |
| JP | 2003022985 | | 1/2003 |
| KR | 96-8556 B1 | | 6/1996 |
| KR | 1998-041043 A | | 5/1999 |
| KR | 100214526 B1 | | 5/1999 |
| KR | 2000-0012027 A | | 2/2000 |
| KR | 10-20020028337 | | 4/2002 |
| WO | WO 00/63959 | | 10/2000 |

* cited by examiner

METHODS OF FORMING METAL INTERCONNECTIONS OF SEMICONDUCTOR DEVICES BY TREATING A BARRIER METAL LAYER

RELATED APPLICATION

This application is a divisional of application Ser. No. 10/373,368, filed Feb. 24, 2003, now U.S. Pat. No. 6,955, 983 entitled Methods of Forming Metal Interconnections of Semiconductor Devices by Treating a Barrier Metal Layer, and claims the benefit of Korean Patent Application No. 2002-0030294, filed May 30, 2002, the disclosure of which is hereby incorporated herein by reference in its entirety as if set forth fully herein.

FIELD OF THE INVENTION

This invention relates to methods of fabricating semiconductor devices such as integrated circuit devices and semiconductor devices so fabricated, and more particularly to methods of forming metal interconnections for semiconductor devices and metal interconnections-so fabricated.

BACKGROUND OF THE INVENTION

As the critical dimensions of integrated circuits become smaller and smaller, it may become increasingly difficult to make a metal interconnection, e.g., an aluminum interconnection, for use in a semiconductor device. In forming a metal interconnection, it may be desirable to completely fill a contact hole, which is a connection between a lower conductive layer and an upper aluminum interconnection, or a via hole, which is a connection between lower and upper aluminum interconnections, with an interconnection material.

To fill the contact hole or via hole (hereinafter, referred to as a "contact hole" or simply as a "hole") with aluminum, various process techniques have been developed to attempt to obtain superior electrical characteristics and filling characteristics. In a highly integrated memory device, an aspect ratio of a contact hole may become higher during a deposition process of forming a metal interconnection having a critical dimension of 0.25 μm or less. Thus, physical vapor deposition (PVD) such as a sputtering process may not be amenable for use during the deposition process. Efforts have been made to develop various methods of forming an aluminum interconnection using chemical vapor deposition (CVD) that can have superior step coverage characteristics in comparison with PVD. In particular, preferential metal deposition (PMD) has been developed to selectively form an aluminum thin layer only in a contact hole by CVD and depositing an aluminum layer outside the contact hole by PVD.

Figure 1A:
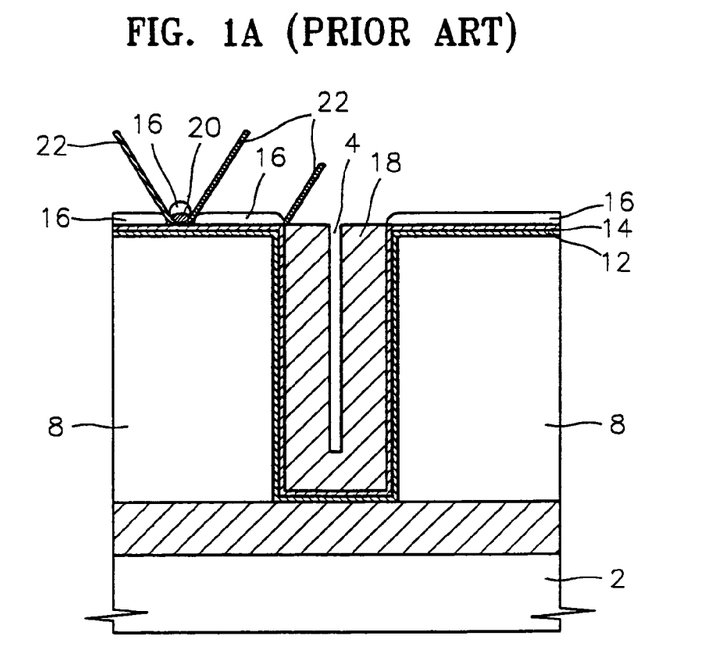
FIGS. 1A and 1B are cross-sectional views of a conventional method of fabricating a metal interconnection of a semiconductor device, using a preferential meal deposition (PMD)
Figure 1B:
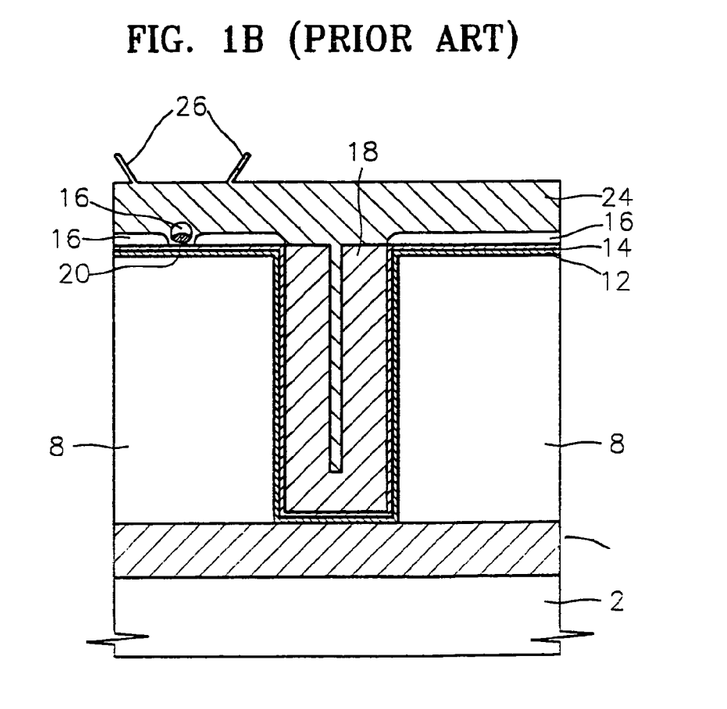

FIGS. 1A and 1B are cross-sectional views illustrating a conventional method of fabricating a metal interconnection of a semiconductor device by PMD. Referring to FIG. 1A, first, a dielectric layer pattern, such as an interlevel dielectric pattern 8, for defining a contact hole 4, is formed on a semiconductor substrate 2. Next, an ohmic metal layer 12 and a barrier metal layer 14 are sequentially formed on the interlevel dielectric layer pattern 8. Thereafter, an anti-nucleation layer 16 is formed on the interlevel dielectric layer 8, so that only a portion of the barrier metal layer 14, which is formed along the sidewalls and bottom of the contact hole 4, is exposed. Next, an aluminum thin layer 18 is selectively formed in the contact hole 4 using CVD, whereby an aluminum precursor is hardly deposited outside the contact hole 4. As a result, such selective deposition of aluminum can have higher step coverage characteristics than a blanket deposition of aluminum. Thus, the PMD process may be suitable for a process of filling a contact hole of a small size with aluminum.

However, it may be almost inevitable that particles 20 are generated during various processes, such as the selective CVD of forming the aluminum thin layer 18 in the contact hole 4, an etching process, and/or a deposition process. Around the particles 20 and/or the circumference of the contact hole 4, the anti-nucleation layer 16 may be poorly deposited so that the barrier metal layer 14 may be incompletely covered with the anti-nucleation layer 16. Therefore, a monocrystalline growth portion 22 may be formed around the particles 20 and/or the circumference of the contact hole 4, due to undesired growth of aluminum. In general, the undesired growth of aluminum may be caused around the particles 20 and/or the circumference of the contact hole 4 in which a portion of the barrier metal layer 14 is not evenly covered with the anti-nucleation layer 16. Thus, the barrier metal layer 14 may be exposed through the anti-nucleation layer 16. This undesired growth may be due to a difference between the selective aluminum growth characteristics of the barrier metal layer 14 and the anti-nucleation layer 16. That is, aluminum may be single-crystal grown only in one direction on the barrier metal layer 14 that has better selective aluminum growth characteristics than the anti-nucleation layer 16, thereby forming the monocrystalline growth portion 22. After forming the monocrystalline growth portion 22, if the blanket deposition of aluminum is performed using PVD to form an aluminum interconnection 24, undesired aluminum growth portions 26 may be present on the aluminum interconnection 24 as illustrated in FIG. 1B, which may cause a bridging phenomenon in a multilevel metal interconnection and/or other undesirable effects.

SUMMARY OF THE INVENTION

Some embodiments of the invention provide methods of forming a metal interconnection of a semiconductor device by forming a dielectric pattern including a hole therein on a substrate, and forming a barrier metal layer in the hole and on the dielectric layer pattern outside the hole. At least some of the barrier metal layer is oxidized. An anti-nucleation layer is selectively formed on the oxidized barrier metal layer outside the hole that exposes the oxidized barrier metal layer in the hole. A metal layer then is selectively formed on the exposed oxidized barrier layer in the hole. In some embodiments, the metal layer is a first metal layer, and a second metal layer also is formed on the anti-nucleation layer and the first metal layer. The second metal layer may be reflowed by thermal treatment.

The hole may be a contact hole and/or a via hole that exposes a predetermined region of the semiconductor substrate and/or a groove that extends only partially through the dielectric layer pattern. In some embodiments, the hole is a contact hole that exposes a source-drain region or a conductive layer on the semiconductor substrate.

The barrier metal layer may comprise TiN, TaN, TiAlN, TiSiN, TaAlN, TaSiN and/or Wn. Some embodiments may further include forming an ohmic metal layer in the hole and on the dielectric layer pattern outside the hole, before forming the barrier metal layer. The ohmic metal layer may comprise Ti and/or Ta.

In some embodiments, the exposed surface of the barrier metal layer is annealed or treated by rapid thermal nitrification (RTN), under a nitrogen atmosphere containing a small amount of oxygen, such as between about 2% and about 3% oxygen, by volume, so as to oxidize the exposed surface of the barrier metal layer. An oxide of the barrier metal layer may thereby be formed on the barrier metal layer. In some embodiments, the oxide of the barrier metal layer may be tens of Ångstroms in thickness. In some embodiments, the oxide of the barrier metal layer is sufficiently thick to reduce nucleation of the metal layer on the anti-nucleation layer, compared to absence of the oxide of the barrier metal layer, but is sufficiently thin to allow the metal interconnect to remain conductive.

In some embodiments, the annealing by RTN is carried out in an $N_2$ and/or $NH_3$ atmosphere under atmospheric pressure. The annealing is carried out at about 100° C. to about 600° C., for about 10 minutes to about two hours. In other embodiments, the RTN is carried out at about 100° C. to about 800° C. for about 10 to about 180 seconds.

The anti-nucleation layer may comprise an aluminum oxide layer, an aluminum nitride layer, a tantalum oxide layer, a titanium oxide layer and/or a silicon carbide (SiC) layer.

In some embodiments, to form the anti-nucleation layer, a metal thin layer is selectively formed on the barrier metal layer that exposes the barrier metal layer in the hole region, and the metal thin layer is oxidized. The metal thin layer may comprise Al, Zr, Ti, Ta, Sr, Mg, Ba, Ca, Ce and/or Y, and may be formed using a DC magnetron sputtering process.

The oxidation of the metal thin layer may be carried out under an $O_2$ gas atmosphere and/or under a mixture of oxygen-containing gas and/or inert gas. The oxygen-containing gas includes $O_2$, $O_3$, and/or $N_2O$. Otherwise, for oxidation of the metal thin layer, the metal thin layer may be exposed in air and/or oxygen plasma.

In some embodiments, to form the anti-nucleation layer, the metal thin layer is exposed in nitrogen plasma and/or rapidly thermally treated under ammonia gas atmosphere, during nitrifying the metal thin layer.

The first metal layer may be formed by selective metal organic chemical vapor deposition (MOCVD) using a precursor comprising dimethylaluminum hydride (DMAH), dimethylethylamine alane (DMEAA) and/or methylpyrrolidine alane (MPA). The second metal layer may comprise Al and/or Al alloy and may be formed using a DC sputtering process. During the reflowing of the second metal layer, the second metal layer may be thermally treated at about 350° C. to about 500° C.

In other embodiments of the present invention, a metal interconnection of a semiconductor device is fabricated by forming a barrier metal layer on a substrate and thermally treating the barrier layer in a nitrogen atmosphere. An anti-nucleation layer is formed on the thermally treated barrier metal layer that exposes a portion of the thermally treated barrier metal layer. A metal layer is formed on the exposed portion of the thermally treated barrier metal layer. In some embodiments, the metal layer is a first metal layer, and a second metal layer is formed on the anti-nucleation layer and the first metal layer.

In some embodiments, the substrate includes a hole that exposes a conductive region, the barrier metal layer is formed on the semiconductor substrate including the hole, and the anti-nucleation layer is formed on the barrier metal layer except for in the hole. In some embodiments, the first metal layer is formed to completely fill the hole.

In other embodiments of the present invention, a metal interconnection of a semiconductor device is fabricated by forming a dielectric layer pattern including a contact hole therein, on a substrate. A barrier metal layer is formed in the contact hole and on the dielectric layer pattern outside the contact hole. An anti-nucleation layer is formed on the barrier metal layer outside the contact hole, and a metal layer is formed in the contact hole. However, after forming the barrier metal layer, the surface of the barrier metal layer is thermally treated so as to reduce selective metal layer growth at a circumference of the contact hole, and/or on the dielectric pattern, compared to absence of the thermal treatment.

Semiconductor devices according to some embodiments of the present invention include a substrate, a dielectric layer on the substrate including a hole therein, and a barrier metal layer in the hole and on the dielectric layer outside the hole. An oxide of the barrier metal layer is included on the barrier metal layer in the hole and outside the hole. An anti-nucleation layer is included on the oxide of the barrier layer outside, the hole that exposes the oxide of the barrier metal layer in the hole. A metal layer is included on the oxide of the barrier metal layer that is exposed in the hole. In other embodiments, the metal layer is a first metal layer, and the device includes a second metal layer on the first metal layer and on the anti-nucleation layer. In some embodiments, the oxide of the barrier metal layer is tens of Ångstroms in thickness. In other embodiments, the oxide of the barrier metal layer is sufficiently thick to reduce nuclei of the metal layer on the anti-nucleation layer, compared to absence of the oxide of the barrier metal layer, but is sufficiently thin to provide conduction between the barrier metal layer and the metal layer.

In still other embodiments, a semiconductor device includes a substrate, a dielectric layer on the substrate, a barrier metal layer on the dielectric layer, and an oxide of the barrier metal layer on the barrier metal layer. An anti-nucleation layer is provided on a first portion of the oxide of the barrier metal layer that exposes a second portion of the oxide of the barrier metal layer. A metal layer is provided on the second portion of the oxide of the barrier metal layer. In some embodiments, the metal layer is a first metal layer, and the device further includes a second metal layer on the first metal layer and on the anti-nucleation layer. As was described above, the oxide of the barrier metal layer may be tens of Ångstroms in thickness and may be sufficiently thick to reduce nuclei, but sufficiently thin to provide conduction.

According to embodiments of the present invention, while fabricating a metal interconnection of a semiconductor device using preferential metal deposition (PMD), a barrier metal layer is formed and then thermally treated in a nitrogen-containing atmosphere to oxidize the surface of the barrier metal layer before forming an anti-nucleation layer. Nucleation of the metal layer on the anti-nucleation layer may be reduced compared to absence of the oxide of the barrier layer. Accordingly, even if a portion of the barrier metal layer, which is incompletely covered with the anti-nucleation layer, is exposed around particles and/or the circumference of a contact hole, it is possible to reduce or prevent a metallic material from abnormally growing on the exposed portion of the barrier metal layer when a metal layer is formed in the contact hole using selective chemical vapor deposition (CVD).

DETAILED DESCRIPTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

It also will be understood that the term "dielectric layer" refers to any dielectric layer on a substrate, such as a conventional interlevel dielectric layer or intermetal dielectric layer that can be formed on or directly on a substrate, a conductive line and/or another dielectric layer.

FIGS. 2A through 2F are cross-sectional views of semiconductor devices according to embodiments of the present invention during intermediate fabrication steps according to embodiments of the present invention.

Figure 2A:
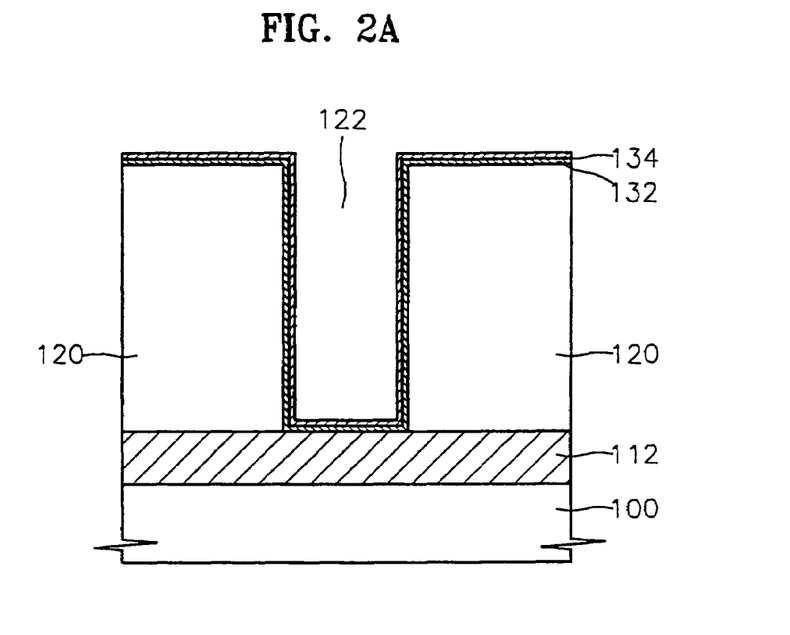
FIGS. 2A through 2F are cross-sectional views of semiconductor devices according to embodiments of the present invention during intermediate fabrication steps according to embodiments of the present invention.

Referring to FIG. 2A, a dielectric layer, such as an interlevel dielectric layer, is formed on a substrate, such as a semiconductor substrate 100, on which a conductive region 112 is exposed. Next, a hole is etched in the interlevel dielectric layer to form a dielectric layer pattern, such as an interlevel dielectric layer pattern 120, which includes a hole 122 therein, which can expose a portion of the conductive region 112.

In some embodiments, the conductive region 112 may be a source/drain region, or a conductive layer of a transistor which is formed on the semiconductor substrate 100. In other embodiments, the conductive region 112 may be a metal interconnection, and the hole 122 may function as a via hole. In FIG. 2A, the conductive region 112 is illustrated to be exposed through the hole 122, but, in other embodiments, the hole 122 may be a groove for forming an interconnection of a damascene structure. In this case, the depth of the groove is smaller than the thickness of the interlevel dielectric layer pattern 120 and the conductive region 112 is not exposed through the groove.

Thereafter, an ohmic metal layer 132 and a barrier metal layer 134 are sequentially formed on the resultant structure on which the interlevel dielectric layer pattern 120 is formed (i.e., in the hole 122 and outside the hole 122). The ohmic metal layer 132 can comprise Ti and/or Ta and, in some embodiments, Ti. The barrier metal layer 134 can comprise TiN, TaN, TiAlN, TiSiN, TaAlN, TaSiN and/or WN, and, in some embodiments, TiN.

Figure 2B:
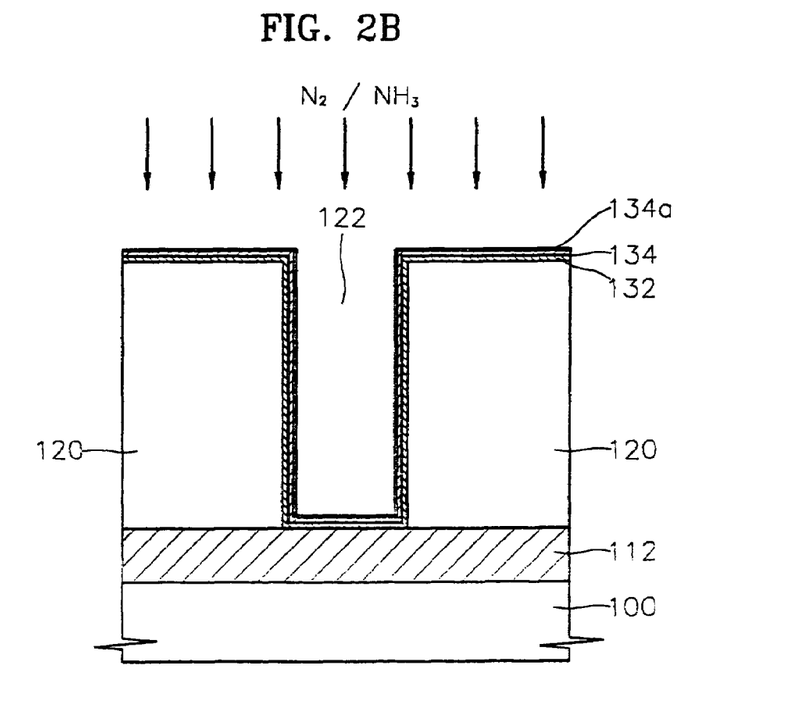

Referring to FIG. 2B, the resultant structure on which the barrier metal layer 134 is exposed is thermally treated in a nitrogen atmosphere containing a small amount of oxygen. In some embodiments, between about 2% and about 3% oxygen, by volume, is included. The nitrogen atmosphere may comprise $N_2$ and/or $NH_3$ gas. In some embodiments, when the barrier metal layer 134 is thermally treated under atmospheric pressure, a small amount of oxygen will be contained in the nitrogen atmosphere without the need for additional supply of oxygen. Therefore, during the thermal treatment, the surface of the barrier metal layer 134 is oxidized. An oxide 134a is thereby formed on the barrier metal layer. This oxide layer 134a may be tens of Ångstroms in thickness.

In some embodiments, for the thermal treatment of the barrier metal layer 134, annealing may be performed on the barrier metal layer 134 at about 100° C. to about 600° C. in a nitrogen atmosphere under atmospheric pressure for about ten minutes to about two hours. In some embodiments, annealing is performed on the barrier metal layer 134 at about 300° C. to about 600° C. for about 10 minutes to about 30 minutes.

In yet other embodiments, a rapid thermal nitrification (RTN) may be performed on the barrier metal layer 134 at about 100° C. to about 800° C. in a nitrogen atmosphere under atmospheric pressure for about 10 seconds to about 180 seconds. In some embodiments, the RTN is performed on the barrier metal layer 134 at about 400° C. to about 800° C. in a nitrogen atmosphere under atmospheric pressure for about 10 seconds to about 60 seconds.

As mentioned above, oxidizing of the surface of the barrier metal layer 134 in a nitrogen atmosphere containing a small amount of oxygen results in formation of an oxide layer 134a on the barrier metal layer 134. This oxidized surface of the barrier layer may be tens of Ångstroms in thickness. Thus, when an anti-nucleation insulating layer is formed on the barrier metal layer in the subsequent process, even if the surface of the barrier metal layer 134 is exposed through an irregularly deposited anti-nucleation insulating layer, the oxide layer 134a can help remarkably to reduce a difference between the selective metal growth characteristics of the surface of the barrier metal layer 134 and the anti-nucleation insulating layer, thereby reducing or preventing abnormal growth of metal on the exposed portion of the barrier metal layer 134. In some embodiments, the oxide 134a of the barrier metal layer 134 is sufficiently thick to reduce nucleation of the metal layer on the anti-nucleation layer, compared to absence of the oxide 134a of the barrier metal layer 134, but is sufficiently thin to allow the metal interconnect to remain conductive, i.e., to provide conduction between the barrier metal layer 134 and a metal layer that is formed thereon subsequently. Accordingly, the oxide 134a of the barrier metal layer need not be removed, because it need not negatively affect the overall contact resistance.

Figure 2C:
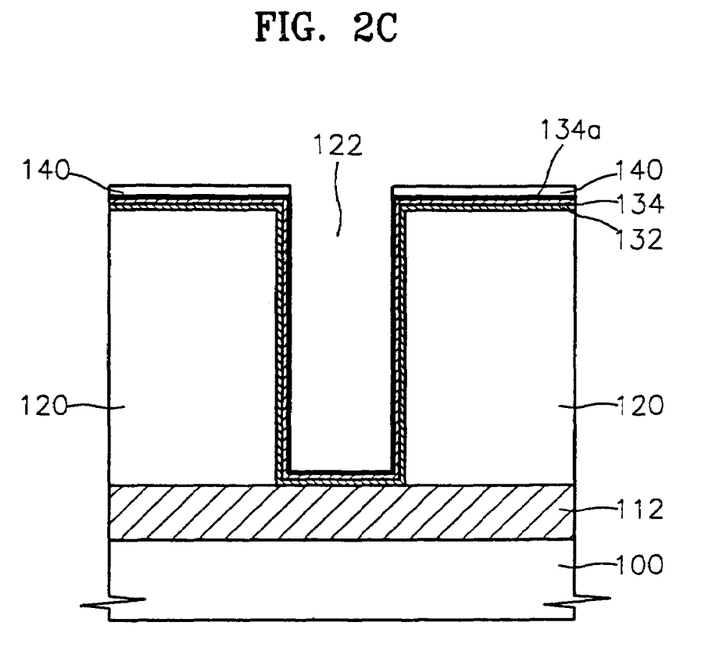

Referring to FIG. 2C, the anti-nucleation layer 140 is formed on the oxidized barrier metal layer 134 on the interlevel dielectric layer pattern 120 but not on the oxidized barrier metal layer 134 in the hole 122. In some embodiments, the anti-nucleation layer 140 may be an insulating layer such as an aluminum oxide layer, an aluminum nitride layer, a tantalum oxide layer, a titanium oxide layer, and/or a silicon carbide (SiC) layer. In some embodiments, an aluminum oxide layer is used.

For instance, to form the anti-nucleation layer 140 in some embodiments, physical vapor deposition (PVD) such as a sputtering process is performed on the oxidized barrier metal layer 134, to form a metal thin layer to a thickness of about 20 Å to about 300 Å. Next, the metal thin layer is oxidized. In some embodiments, the metal thin layer comprises a material having greater oxidation characteristics than Si.

For example, the metal thin layer may comprise Al, Zr, Ti, Ta, Sr, Mg, Ba, Ca, Ce and/or Y. In some embodiments, a DC magnetron sputterer having no collimator is used during the formation of the metal thin layer. A DC magnetron sputtering process for forming the metal thin layer may be performed at low temperature of from about 10° C. to about 30° C. under about 3 mTorr to about 10 mTorr, in some embodiments, under about 5 mTorr to about 10 mTorr. When the metal thin layer is formed using DC magnetron sputtering having no collimator under the aforementioned conditions, it can remove straight motion of metal atoms, thereby reducing or preventing the metal thin layer from forming in the hole 122. Accordingly, the metal thin layer can be formed only on the portions of the oxide 134a of the barrier metal layer 134 formed on the interlevel dielectric layer pattern 120, whereby the oxide 134a of the barrier metal layer 134 is exposed in the hole 122.

To form the anti-nucleation layer 140, the metal thin layer may be oxidized in various ways. In some embodiments, oxidation of the metal thin layer may be performed under an $O_2$ gas atmosphere in an airtight container having lower pressure than atmospheric pressure. In other embodiments, the metal thin layer may be oxidized under a mixture gas atmosphere of an oxygen-containing gas and an inert gas in an airtight container having lower pressure than atmospheric pressure. The oxygen-containing gas may be $O_2$, $O_3$ and/or $N_2O$. In yet other embodiments, the metal thin layer may be oxidized by exposing the same in air and/or oxygen plasma.

In still other embodiments, the anti-nucleation layer 140 may be formed by forming a metal thin layer as described above and nitrifying it. For instance, if the metal thin layer comprises aluminum, its nitrification may be performed by exposing the resultant structure, on which the aluminum thin layer is formed, to a nitrogen plasma and/or rapid thermal treating in an ammonia gas atmosphere.

Figure 2D:
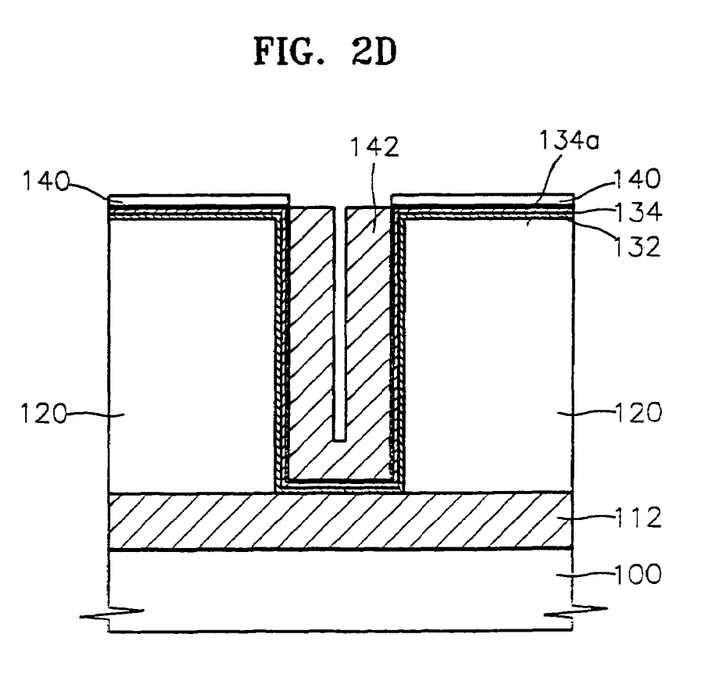

Referring to FIG. 2D, a first metal layer 142 is formed only on the oxide 134a of the barrier metal layer 134 formed along the hole 122 that is exposed through the anti-nucleation layer 140 using a selective CVD. In some embodiments, a region defined by the exposed portion of the oxide 134a of the barrier metal layer 134 in the hole 122 is filled with the first metal layer 142.

The first metal layer 142 may comprise Al, and may be formed by selective metal organic chemical vapor deposition (MOCVD), for example. The selective MOCVD for forming the first metal layer 142 may be performed, using an aluminum precursor comprising an organometallic compound, such as dimethylaluminum hydride (DMAH), dimethylethylamine alane (DMEAA), or methylpyrrolidine alane (MPA), at about 100° C. to about 150° C. under about 0.5 torr to about 5 torr, and in some embodiments, at 120° C. under 1 torr. During the selective MOCVD, the precursor may be supplied to a CVD chamber, using a material transfer apparatus of a bubbler type, a vapor flow controller type and/or a liquid delivery system type. An inert gas containing Ar and/or Ne is used as a carrier gas.

The surface of the barrier metal layer 134 was thermally treated and oxidized under a nitrogen atmosphere containing a small amount of oxygen, as explained with reference to FIG. 2B. Therefore, even if a portion of the barrier metal layer 134 is exposed due to the presence of particles or irregular deposition of the anti-nucleation layer 140 on the barrier metal layer 134 around the circumference of the hole 122, a difference between the selective metal growth characteristics of the exposed portion of the barrier metal layer 134 and the anti-nucleation layer 140 can be reduced during the selective MOCVD. The first metal layer 142 thus may be formed only in the hole 122, thereby reducing or preventing an exposed portion of the barrier metal layer 134 from abnormally growing around the particles and/or around the circumference of the hole 122.

Figure 2E:
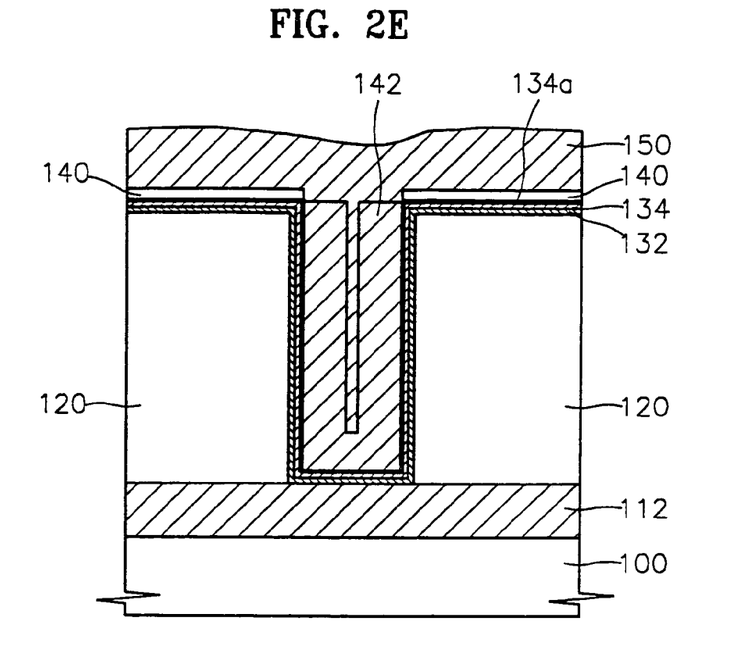

Referring to FIG. 2E, a second metal layer 150 is formed on the resultant structure on which the first metal layer 142 is formed, for example, using PVD. In some embodiments, the second metal layer 150 comprises Al and/or an Al alloy.

The second metal layer 150 may be formed using PVD, for example, by a DC sputtering process, a DC magnetron sputtering process, an AC sputtering process, and/or an AC magnetron sputtering process. In some embodiments, the second metal layer 150 is formed using a DC magnetron sputtering process. In some embodiments, the formation of the second metal layer 150 may be carried out by equipment of an integral cluster tool type under a vacuum atmosphere immediately after the formation of the first metal layer 142.

Figure 2F:
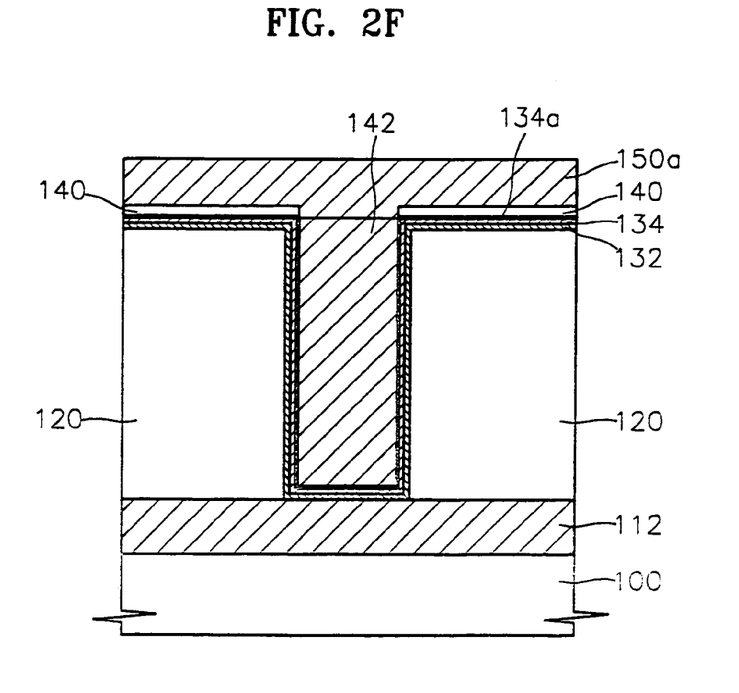

Referring to FIG. 2F, the resultant structure on which the second metal layer 150 is formed is thermally treated to reflow under a vacuum atmosphere. In some embodiments, the above resultant structure is thermally treated at about 350° C. to about 500° C. under an inert gas atmosphere, e.g., Ar gas atmosphere, under the vacuum atmosphere for about several seconds to about several minutes, in some embodiments, from about 30 seconds to about 180 seconds. In some embodiments, the thermal treatment for the reflow of the second metal layer 150 is carried out while suppressing oxidation of the surface of the second metal layer 150 to the maximum extent. For this reason, the thermal treatment in some embodiments is performed under high vacuum pressure of 1 torr or less, preferably, under $10^{-6}$ torr or less.

As a result of thermally treating the resultant structure having the second metal layer 150 thereon, metal layers move due to the reflow of the resultant structure to completely fill the inside of the contact hole 122, thereby forming a metal layer 150a having a planarized surface.

Referring again to FIG. 2F, semiconductor devices according to some embodiments of the present invention include a substrate 100, such as an integrated circuit substrate and a dielectric layer, such as an interlayer dielectric layer 120, on the substrate including a hole 122 therein. A barrier metal layer 134 is contained in the hole 122 and on the dielectric layer outside the hole 122. An oxide 134a of the barrier metal layer 134 is included on the barrier metal layer 134. An anti-nucleation layer 140 is included on the oxide 134a of the barrier metal layer 134 outside the hole 122 that exposes the oxide 134a of the barrier metal layer 134 in the hole 122. A metal layer 142 is included on the oxide 134a of the barrier metal layer 134 that is exposed in the hole 122. In other embodiments, the anti-nucleation layer 140 defines first and second portions of the oxide 134a of the barrier metal layer 134, without the need for a hole 122.

As was described above, using methods of forming a metal interconnection of a semiconductor device according to some embodiments of the present invention, it is possible to reduce or prevent abnormal growth of metal on a portion of the barrier metal layer 134, which is exposed via the anti-nucleation layer 140 due to the presence of particles on the interlevel dielectric layer 120 on which the barrier metal layer 140 is formed, during the selective MOCVD for forming the first metal layer 142. Accordingly, occurrence of bridging or other undesirable effects can be reduced or prevented when completing a multi-level metal interconnection.

A metal interconnection layer is formed using preferential metal deposition (PMD) in a method of forming a metal interconnection of a semiconductor device according to some embodiments of the present invention. During the PMD, a barrier metal layer is formed in a hole or on a dielectric layer, and the surface of the barrier metal layer is thermally treated under a nitrogen atmosphere to be oxidized, prior to forming an anti-nucleation layer on the dielectric layer, thereby reducing or eliminating differences between the selective metal growth characteristics of the barrier metal layer and the anti-nucleation layer. In some embodiments, even if a portion of the barrier metal layer is exposed due to irregular deposition of the anti-nucleation layer around particles and/or the circumference of the hole, abnormal growth of metal on the barrier metal layer, which is exposed via the anti-nucleation layer, can be reduced or prevented. Accordingly, metal interconnections having smooth surfaces, i.e., having little or no abnormal growth portion of metal, can be obtained even after depositing a metal layer inside the hole by the PVD. Therefore, it is possible to reduce or eliminate causes of malfunction of a metal-interconnection of a highly integrated semiconductor device having a small design rule, e.g., the bridging phenomenon due to abnormal growth of metal.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a metal interconnection of a semiconductor device, the method comprising:

forming a dielectric layer pattern including a hole therein, on a substrate;

forming a barrier metal layer in the hole and on the dielectric layer pattern outside the hole;

oxidizing an exposed surface of the barrier metal layer to form an oxidized surface of the barrier metal layer, wherein oxidation of the exposed surface of the barrier metal layer is conducted in a nitrogen atmosphere in the absence of an additional supply of oxygen;

selectively forming an anti-nucleation layer on the oxidized surface of the barrier metal layer outside the hole that exposes the oxidized surface of the barrier metal layer in the hole; and selectively forming a metal layer on the exposed oxidized surface of the barrier metal layer in the hole.

2. The method of claim 1, wherein the selectively forming the anti-nucleation layer comprises:

selectively forming a metal thin layer on the oxidized surface of the barrier metal layer outside the hole that exposes the oxidized surface of the barrier metal layer in the hole; and nitrifying the metal thin layer.

3. The method of claim 2, wherein the metal thin layer comprises Al.

4. The method of claim 2, wherein the metal thin layer is formed using a DC sputtering process.

5. The method of claim 2, wherein during nitrification of the metal thin layer, the metal thin layer is exposed to nitrogen plasma.

6. The method of claim 2, wherein during nitrification of the metal thin layer, the metal thin layer is rapidly thermally treated under an ammonia gas atmosphere.

* * * * *

UNITED STATES PATENT AND TRADEMARK OFFICE
CERTIFICATE OF CORRECTION

PATENT NO.         : 7,384,866 B2                                      Page 1 of 1
APPLICATION NO.    : 11/095006
DATED              : June 10, 2008
INVENTOR(S)        : Yun et al.

It is certified that error appears in the above-identified patent and that said Letters Patent is hereby corrected as shown below:

On Title Page:
Item 56, References Cited, U.S. Patent Documents:
    Please add -- 5,955,983  Yun et al.  06/26/2003 --

Please correct "6,955,983  Yum et al.  10/18/2005"
        To read -- 6,955,983  Yun et al.  10/18/2005 --

Signed and Sealed this

Thirtieth Day of September, 2008

JON W. DUDAS
*Director of the United States Patent and Trademark Office*